United States Patent [19]

Koegl et al.

[11] Patent Number: 5,514,978
[45] Date of Patent: May 7, 1996

[54] STATOR TURN FAULT DETECTOR FOR AC MOTOR

[75] Inventors: Rudolph A. A. Koegl, Niskayuna; William J. Premerlani, Scotia; Gerald B. Kliman, Schenectady, all of N.Y.

[73] Assignee: General Electric Company, Schenectady, N.Y.

[21] Appl. No.: 407,550

[22] Filed: Mar. 20, 1995

[51] Int. Cl.$^6$ .................................................. G01R 21/00
[52] U.S. Cl. ...................... 324/772; 324/545; 340/648; 318/690; 364/483
[58] Field of Search .................... 324/545, 772, 324/547; 318/690, 490; 364/483

[56] References Cited

U.S. PATENT DOCUMENTS 4,547,726  10/1985  Premerlani .
4,715,000  12/1987  Premerlani .
5,270,640  12/1993  Kohler et al. .

OTHER PUBLICATIONS

"Alternatives for Assessing the Electrical Integrity of Induction Motors" by Jeffrey L. Kohler, et al, IEEE Transactions on Industry Applications, vol. 28, No. 5, Sep./Oct. 1992, pp. 1109–1117.
U.S. Patent Application, "Turn Fault Detection" by Kliman, Serial No. 08/285,469 filed Aug. 3, 1994.

Primary Examiner—Kenneth A. Wieder
Assistant Examiner—Barry C. Bowser
Attorney, Agent, or Firm—Ann M. Agosti; Marvin Snyder

[57] ABSTRACT

Motor current and voltage waveforms are measured and converted to digitized current and voltage waveforms. A weighted discrete fourier transform is applied to the digitized current and voltage waveforms to obtain negative sequence current and voltage phasors; and the negative sequence current and voltage phasors are used to determine the existence of a turn fault. The use of the negative sequence current and voltage phasors can be performed by employing one of several techniques. In a first embodiment, an apparent negative sequence impedance is estimated by dividing the negative sequence voltage phasor by the negative sequence current phasor for comparison with a threshold negative sequence impedance. In a second, related embodiment, a current differential is estimated by dividing the negative sequence voltage phasor by a characteristic negative sequence impedance and subtracting the result from the negative sequence current phasor for comparison with a threshold current differential. In a third, related embodiment, a voltage differential is estimated by multiplying the negative sequence current phasor by a characteristic negative sequence impedance and subtracting the result from the negative sequence voltage phasor for comparison with a threshold voltage differential. In either of the second or third embodiments, the characteristic negative sequence impedance can be obtained by inserting a calibration device into one phase of the motor.

14 Claims, 7 Drawing Sheets

STATOR TURN FAULT DETECTOR FOR AC MOTOR

BACKGROUND OF THE INVENTION

1. Field of the Invention

This invention relates generally to motors and, more particularly, to detection of turn faults in induction motors.

2. Description of the Related Art

In one method of detecting a turn fault in an AC motor, as described in Kohler et al., U.S. Pat. No. 5,270,640, line current and voltage phasors are determined in an initial step by performing a fast fourier transform (FFT) on current and voltage waveforms. The FFT generally requires several 360 degree cycles. In an additional step, the standard symmetrical component transformation of these phasors is performed to derive the positive and negative sequence voltages and currents from which the impedance phasors can be calculated. Because considerable averaging must be done in finding the phasors and calculating the impedances, the measurement is time consuming and can require at least several cycles. Additionally, the results can be strongly affected by noise.

Conventional implementations of negative sequence impedance methods of on-line turn fault detection have lacked resolution with poor signal-to-noise ratio resulting from considerable noise and harmonics. Furthermore, induced faults often register as increased impedance, which is a phenomena that appears to contradict the notion that the impedance should decrease when shorts occur in a phase. Moreover, when the incoming line has relatively low negative sequence voltages, the impedance becomes indefinite and its value can vary widely.

Most mathematical analyses of turn faulted motors assume a motor that is, except for the fault, symmetric and that is excited by symmetric three phase lines. The complexity and computation required in these models causes them to be unsuitable for evaluating turn faults in unsymmetric motors excited by unsymmetric lines.

SUMMARY OF THE INVENTION

Accordingly, an object of one embodiment of the invention is to provide an instrument that will quickly detect turn faults in motors while the motors are running, under conditions of both balanced and unbalanced supply voltages, as well as variations in supply voltage, while factoring realistic measurement accuracies and other sources of error.

It has been discovered through an approximate, equivalent circuit model of a faulted motor that the result of a turn fault does not arise from a change in the negative sequence impedance, which is essentially constant except for load effects, but instead is influenced by a fault current that is injected into the negative sequence circuit from the positive sequence circuit via coupling through the fault. The injected current, which is separated from the current in the negative sequence impedance, can thus be used as a fault indicator.

A weighted discrete fourier transform (WDFT) is used to directly calculate and filter the negative sequence voltage and current phasors in one step, in order to find the negative sequence variable to be used as an on-line indicator of a turn fault. In one embodiment the variable is the negative sequence impedance. Conditions under which the negative sequence impedance calculation becomes unreliable are identified, and a method of dealing with them is proposed.

Briefly, in accordance with a preferred embodiment of the invention, a method for detecting turn faults in an induction motor comprises: obtaining motor current and voltage waveforms and converting the waveforms to digitized current and voltage waveforms; applying a weighted discrete fourier transform to the digitized current and voltage waveforms to obtain symmetrical component current and voltage phasors; and determining the existence of a turn fault by employing the symmetrical component current phasors and symmetrical component voltage phasors. Preferably the step of applying a weighted discrete fourier transform to the digitized current waveforms and digitized voltage waveforms to obtain symmetrical component current phasors and symmetrical component voltage phasors includes obtaining a negative sequence voltage phasor and a negative sequence current phasor.

In one embodiment, the step of determining the existence of a turn fault comprises estimating an apparent negative sequence impedance by dividing the negative sequence voltage phasor by the negative sequence current phasor and comparing the estimated apparent negative sequence impedance with a threshold negative sequence impedance.

In a related embodiment, the step of determining the existence of a turn fault comprises estimating a current differential by dividing the negative sequence voltage phasor by a characteristic negative sequence impedance and subtracting the result from the negative sequence current phasor, and comparing the estimated current differential with a threshold current differential.

In another related embodiment, the step of determining the existence of a turn fault comprises estimating a voltage differential by multiplying the negative sequence current phasor by a characteristic negative sequence impedance and subtracting the result from the negative sequence voltage phasor, and comparing the estimated voltage differential with a threshold voltage differential.

In another preferred embodiment of the present invention, a method for obtaining a characteristic negative sequence impedance of an ac motor comprises: inserting a calibration device into one phase of the motor; obtaining calibration motor current and voltage waveforms; converting the calibration current and voltage waveforms to calibration digitized current and voltage waveforms, respectively; applying a weighted discrete fourier transform to the calibration digitized current and voltage waveforms to obtain a calibration negative sequence current phasor and a calibration negative sequence voltage phasor; and dividing the calibration negative sequence voltage phasor by the calibration negative sequence current phasor.

In another preferred embodiment of the present invention, an apparatus for detecting turn faults in an induction motor comprises: at least two current sensors for obtaining at least two motor current waveforms; at least two voltage sensors for obtaining at least two motor voltage waveforms; an analog to digital converter for converting the motor current waveforms to digitized current waveforms and the motor voltage waveforms to digitized voltage waveforms; and a processor for applying a weighted discrete fourier transform to the digitized current waveforms and digitized voltage waveforms to obtain symmetrical component current phasors and symmetrical component voltage phasors and for determining the existence of a turn fault by employing the symmetrical component current phasors and symmetrical component voltage phasors.

In another embodiment, an apparatus for obtaining a characteristic negative sequence impedance of a motor comprises: at least two current sensors for obtaining at least two motor current waveforms; at least two voltage sensors for obtaining at least two motor voltage waveforms; a calibration device coupled between the motor and a respective one of the voltage sensors; an analog to digital converter for converting the motor current waveforms to digitized current waveforms and the motor voltage waveforms to digitized voltage waveforms; and a processor for applying a weighted discrete fourier transform to the digitized current waveforms and digitized voltage waveforms to obtain a calibration negative sequence current phasor and a calibration negative sequence voltage phasor and for dividing the calibration negative sequence voltage phasor by the calibration negative sequence current phasor.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
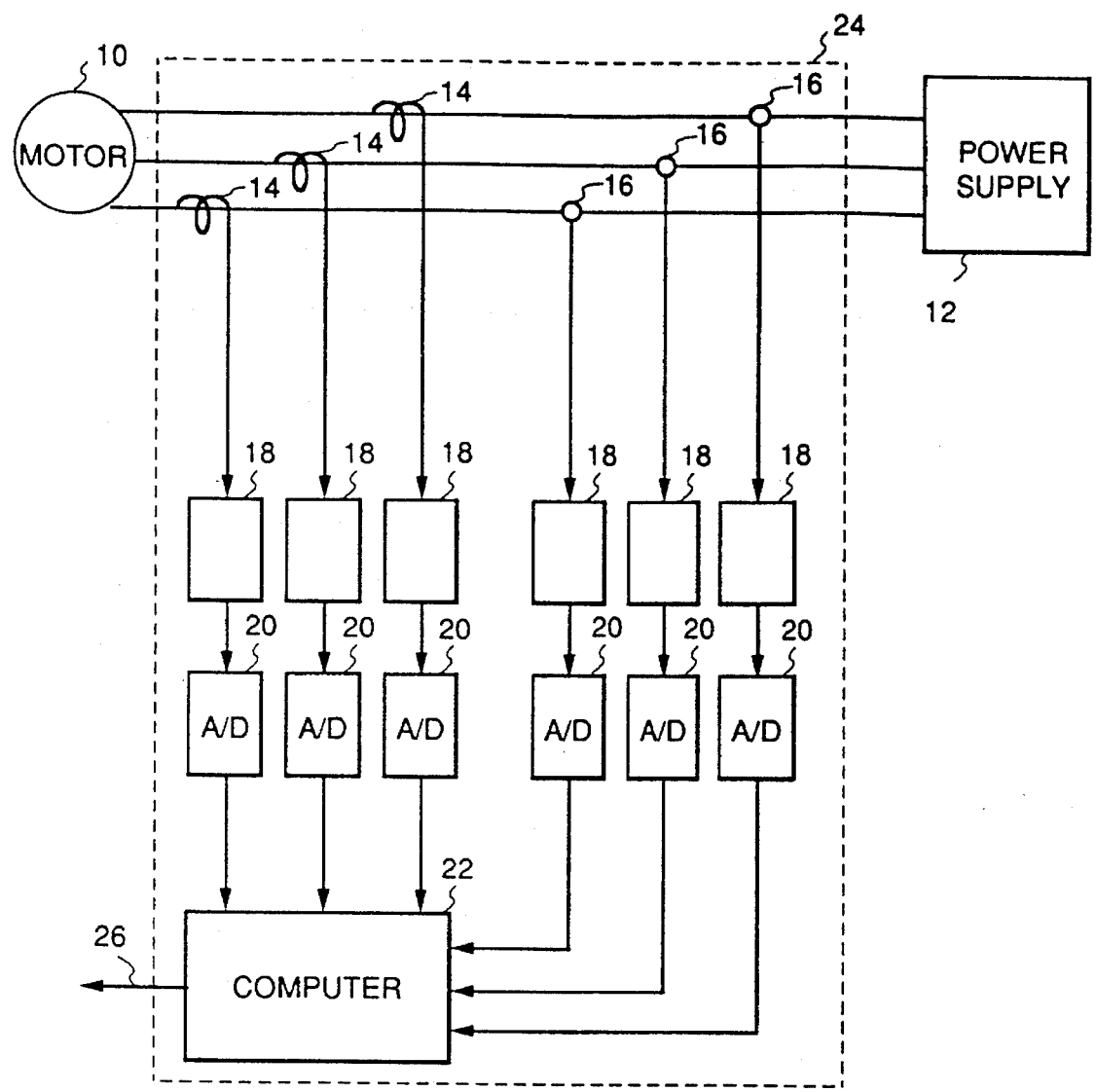
FIG. 1 is a block diagram of a turn fault detector.

FIG. 1 is a block diagram of a data acquisition system 24 for detecting turn faults in an induction motor 10 receiving power from a power supply 12, as disclosed in commonly assigned Kliman, U.S. application Ser. No. 08/285,469, filed Aug. 3, 1994, which is herein incorporated by reference.

Three current sensors 14 measure motor current, and three voltage sensors 16 measure motor voltage waveforms. Although three phase current and three phase voltage sensors are preferred as shown, only two current sensors and voltage sensors are actually required because the third phase current and phase voltage can then each be calculated using Kirchoff's laws. Furthermore, although a three-phase motor is shown, the invention is also applicable to two-phase motors and to motors having more than three phases.

Each measurement of a current or voltage is processed by a respective signal conditioner 18 which may include an amplifier and an anti-aliasing filter which acts as a low-pass filter to remove components greater than one half of the sampling frequency, so that such components do not fold over and interfere with the low-pass measurement.

After the signal conditioning, each conditioned signal can be converted to a digital signal by an analog-to-digital (A/D) converter 20. There can be an individual A/D converter for each individual signal conditioner, as shown, or there can be a single A/D converter with a switch used to convert each of the six signals.

The voltages and currents that are measured can be processed in the computer by being separated into balanced but oppositely rotating sets according to the theory of symmetrical components. These measurements can be used as disclosed in aforementioned Kliman, U.S. application Ser. No. 08/285,469 to determine negative sequence impedance.

Figure 3:
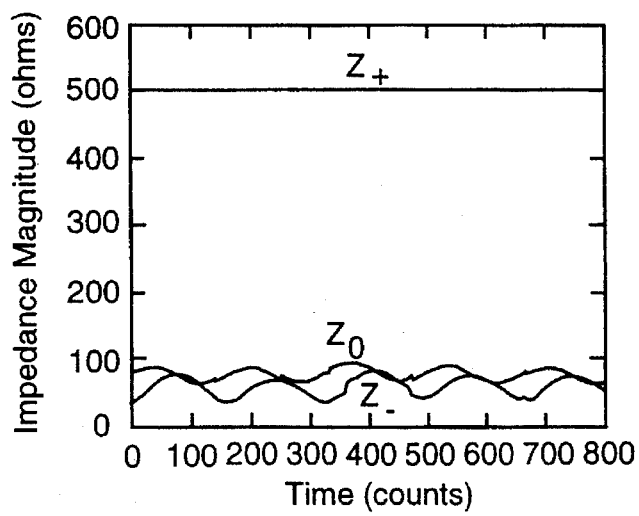
FIGS. 3–5 are graphs of impedance magnitude calculated over time under various fault conditions for a previously disclosed turn fault detection method.
Figure 4:
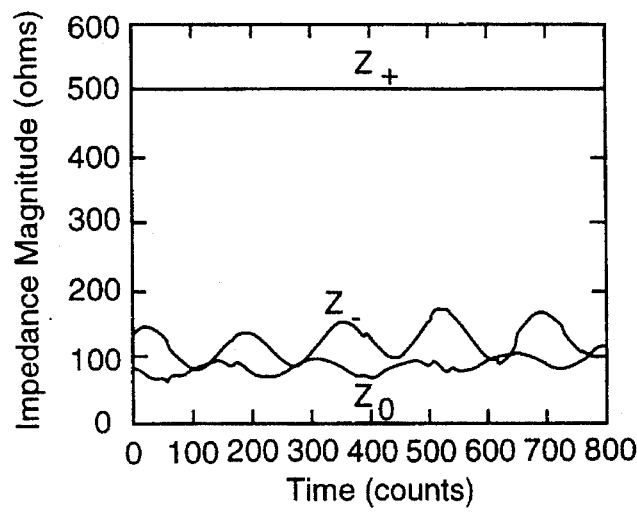
Figure 5:
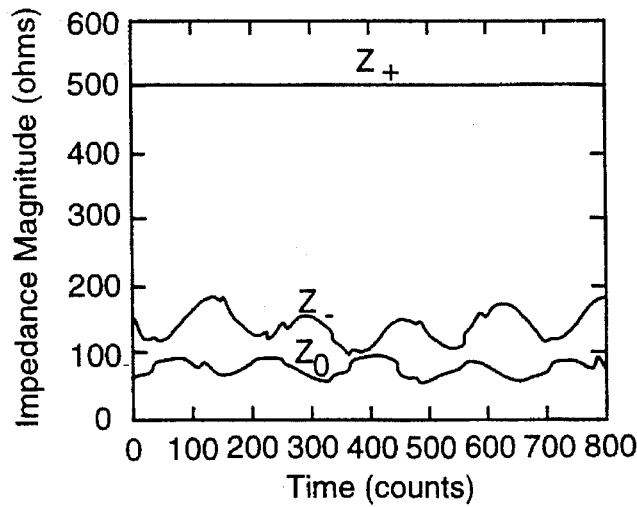

FIGS. 3–5 are graphs of impedance magnitude over time under various fault conditions calculated using the invention of aforementioned Kliman, U.S. application Ser. No. 08/285, 469 for three cases: no fault (FIG. 3); modest fault (FIG. 4); and heavy fault (FIG. 5).

In each of these figures, the positive sequence impedance is relatively noise-free, but considerable second harmonic disturbances occur in the negative sequence impedance. As turn faults are introduced, the average value of the negative sequence impedance increases and the magnitude of the variation of the negative sequence impedance increases. The average value, as discussed above, might be expected to decrease with a turn fault because a short in a phase winding would create a lower impedance. An additional limitation of this technique is that basic current and voltage phasors typically must be calculated by an average over several cycles to provide a reasonable estimate at each data point, and these calculations can require a substantial amount of time.

Inherent instrument imprecision and direct current drift in the amplifiers, filters, and analog-to-digital converters contribute to the sometimes contradictory results. Many of these factors can be digitally compensated; however, noise and seepage of the positive sequence voltages and currents into the negative sequence voltages and currents caused by lack of accurate frequency estimations still limit the precision of the results.

Figure 2:
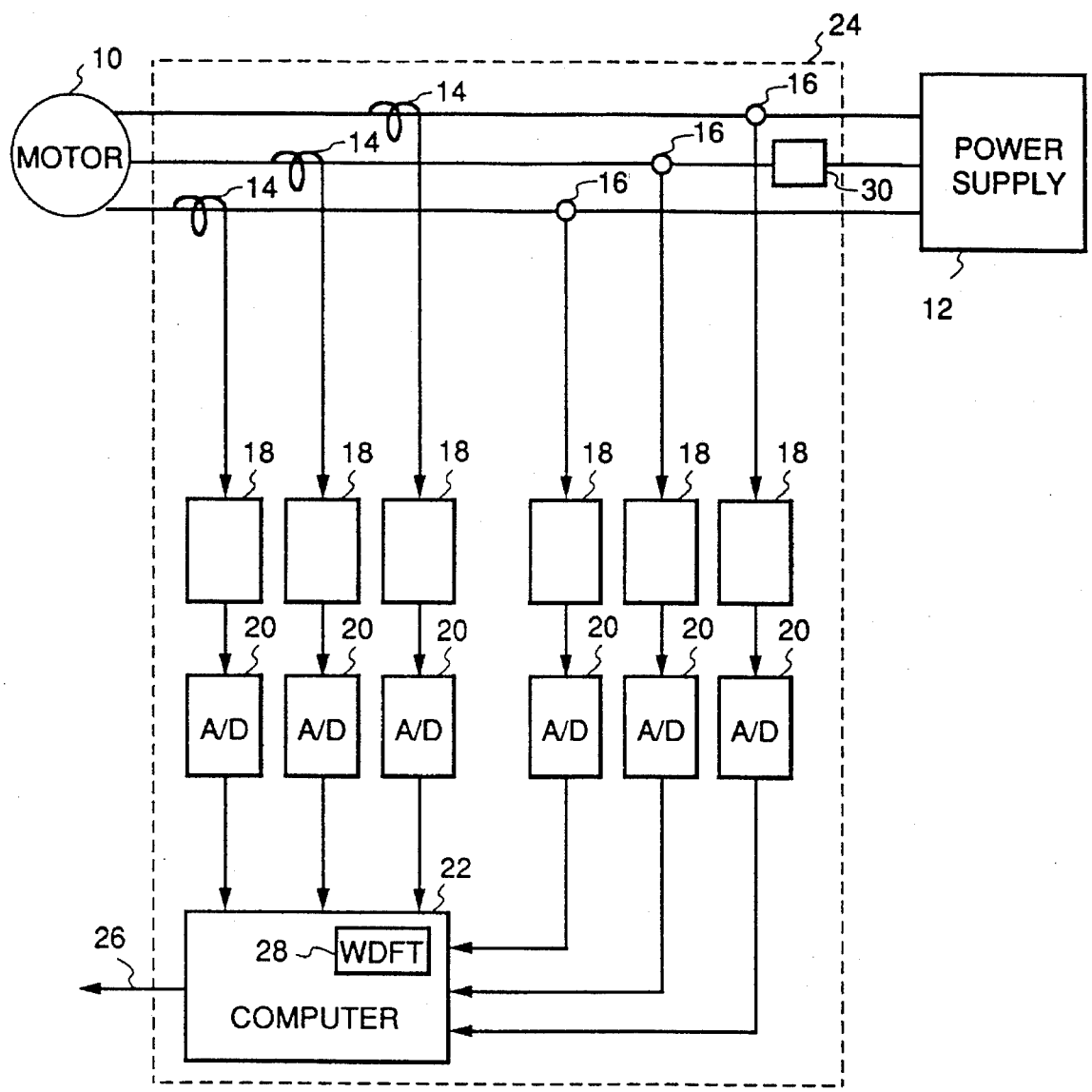
FIG. 2 is a block diagram of a turn fault detector of the present invention.
Figure 9:
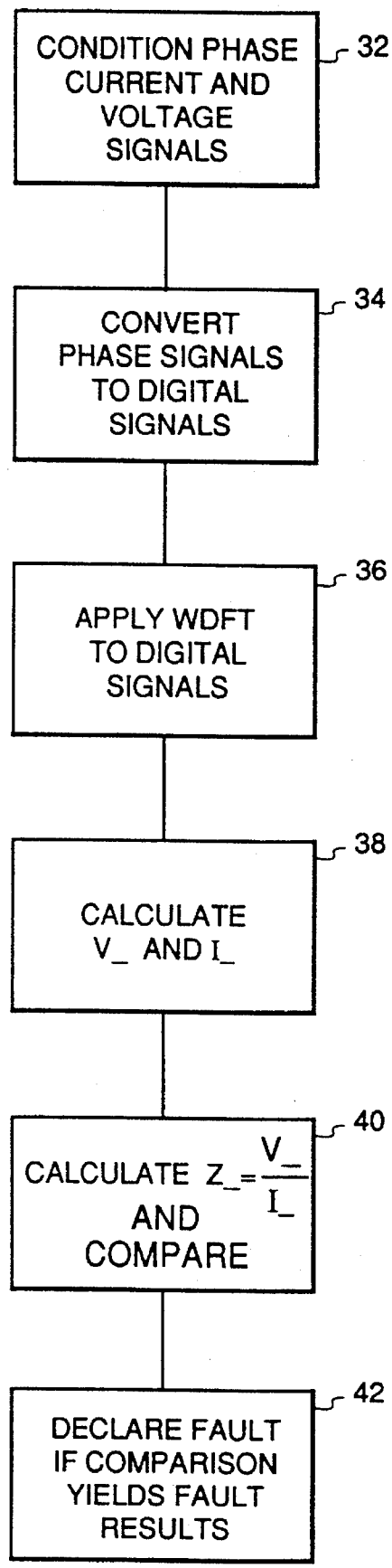
FIG. 9 is a flow chart illustrating one embodiment of the present invention.

FIG. 2 is a block diagram of a turn fault detector of the present invention which uses a weighted discrete fourier transform (WDFT) 28 in the computer to increase the accuracy and precision of the design, and FIG. 9 is a flow chart illustrating one method for detecting turn faults of the present invention. The use of a WDFT compensates for drifts and harmonics and markedly reduces computation time.

Step 32 of conditioning current and voltage signals and step 34 of converting signals to digital signals can be accomplished with signal conditioner 18 and A/D converter 20, as discussed with respect to FIG. 1.

At step 36 the WDFT is applied to the digital signals. The WDFT filters out high frequency signals and DC drifts and only passes fundamental frequency signals. The preferred DFT is similar to that described for determining a respective phasor value for use in determining a power system frequency in commonly assigned Premerlani, U.S. Pat. No. 4,547,726, issued Oct. 15, 1985, which is herein incorporated by reference. In the present invention the DFT is applied to calculate symmetrical component phasors. This is accomplished by combining the symmetrical component transform into the discrete fourier transform, as described below, and thereby eliminating the need to engage in the noisy and time consuming process of finding the amplitude and phase of the line voltages and currents. This technique provides positive, negative, and zero sequence impedances directly and efficiently.

The fundamental component of a DFT is a good estimate of the amplitude and phase angle of the 60 Hz component of power system voltages and currents in the face of noise and harmonics. The following equation represents computation of the fundamental component of a phasor from data samples:

$$X(m) = \frac{2}{N} \sum_{k=m-N}^{m-1} x(k\Delta t)e^{-j2k\frac{\pi}{N}},$$

where X(m) is the estimate of the phasor value of a cycle's worth of samples X, at sample m (real time), with N samples taken per cycle, and where k is the summation index (an integer). For three phase analysis, the process is repeated for each phase:

$$X_a(m) = \frac{2}{N} \sum_{k=m-N}^{m-1} x_a(k\Delta t)e^{-j2k\frac{\pi}{N}}$$

$$X_b(m) = \frac{2}{N} \sum_{k=m-N}^{m-1} x_b(k\Delta t)e^{-j2k\frac{\pi}{N}}$$

$$X_c(m) = \frac{2}{N} \sum_{k=m-N}^{m-1} x_c(k\Delta t)e^{-j2k\frac{\pi}{N}}.$$

Symmetrical components are calculated from the phase components as follows:

$$X_0 = \frac{1}{3}(X_a + X_b + X_c)$$

$$X_+ = \frac{1}{3}(X_a + aX_b + a^2X_c)$$

$$X_- = \frac{1}{3}(X_a + a^2X_b + aX_c),$$

wherein "a" is a phasor of unit magnitude and an angle of 120 degrees ($e^{j2\pi/3}$), $X_o$ is the zero sequence phasor, $X_+$ is the positive sequence phasor, and $X_-$ is the negative sequence phasor.

By combining equations of the DFT and the symmetrical components, it is possible to compute a negative sequence quantity using a weighted discrete fourier transform directly from data samples:

$$X_-(m) = \frac{2}{N} \sum_{k=m-N}^{m-1} x_a(k\Delta t)e^{-j2k\frac{\pi}{N}} +$$

$$\frac{2}{N} \sum_{k=m-N}^{m-1} x_b(k\Delta t)e^{-j(2k\frac{\pi}{N} + \frac{2\pi}{3})} +$$

$$\frac{2}{N} \sum_{k=m-N}^{m-1} x_c(k\Delta t)e^{-j(2k\frac{\pi}{N} + \frac{4\pi}{3})}$$

If the sampling frequency is synchronized to the line frequency, for example, in a manner such as disclosed in commonly assigned Premerlani, U.S. Pat. No. 4,715,000, issued Dec. 22, 1987, which is herein incorporated by reference, the number of sample points can be reduced to as few as sixteen per cycle without affecting the resolution and accuracy of the method. If the sampling frequency is not synchronized, but is an exact multiple of the nominal line frequency, the approach will have good resolution if the line frequency has not drifted too far from the nominal frequency. If the line frequency has drifted, the use of more samples per cycle (i.e., 32, 64, etc.) can be helpful.

After the WDFT is applied and V_ and I_ are calculated at step 18 using the above equation, at step 40 the impedance of Z_ is obtained from dividing V_ by I_. Z_ is then compared with a threshold or nominal negative sequence impedance to determine whether a fault exists.

The value of the negative sequence impedance is continuously monitored. When step 42 indicates that the negative sequence impedance deviates from the threshold negative sequence impedance by a significant amount (about 10–20% in one embodiment), an alarm can indicate that a turn fault has occurred. The threshold negative sequence impedance can be predicted from a knowledge of the motor parameters or by tests on several motors of the same type known to be without turn faults (by conventional off-line methods). Alternately, the threshold negative sequence impedance at installation can be used, assuming the motor is in good condition.

If desired, the invention disclosed in aforementioned Kliman, U.S. application Ser. No. 08/285,469, of estimating the load variation effect on negative sequence impedance can be used to further refine the analysis.

The method of using a combination of a DFT and symmetrical component analysis filters out most line noise at frequencies higher than that of the line and makes the calculation extremely rapid because it can be possible to perform the calculation in just over one cycle. Synchronization to the line can be accomplished by using software control of the analog-to-digital converters which is commonly available in combination with, for example, a phase locked loop as described in aforementioned U.S. Pat. No. 4,715,000. The present invention provides a rapid and sensitive method of determining whether a polyphase motor has a turn fault in the stator.

Figure 6:
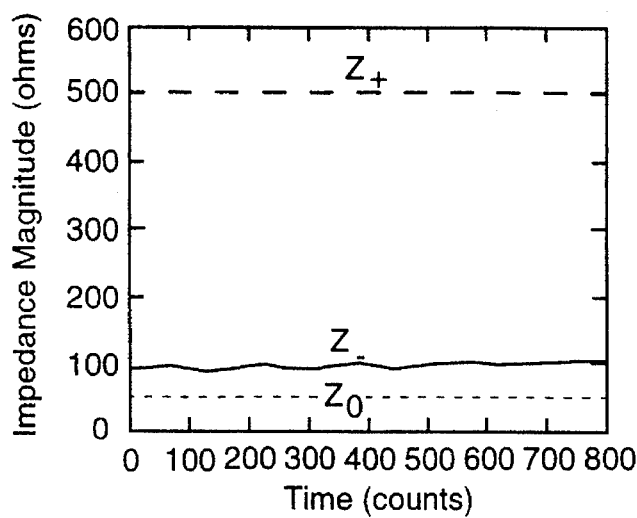
FIGS. 6–8 are graphs of impedance magnitude calculated over time under various fault conditions using the present invention.
Figure 7:
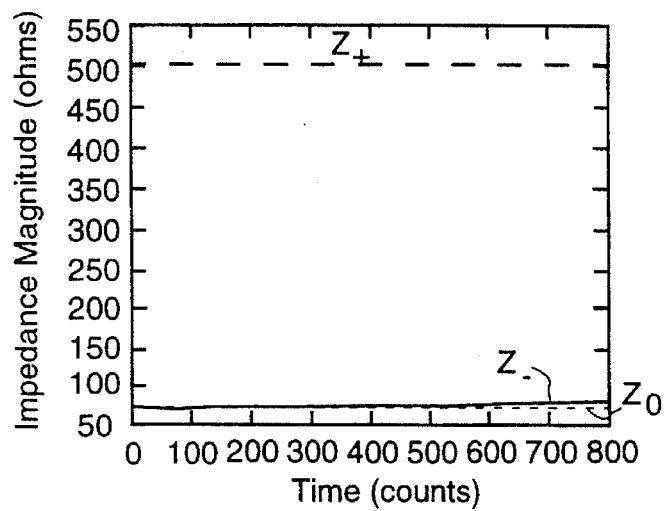
Figure 8:
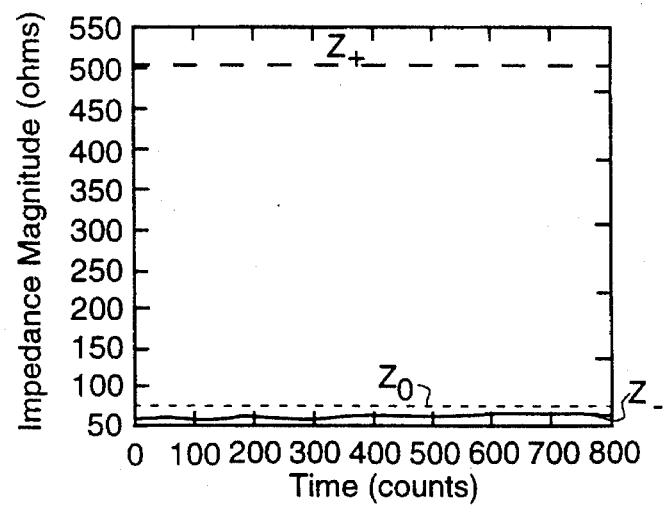

FIGS. 6–8 are graphs of impedance magnitude over time under various fault conditions calculated using the same (unsynchronized) data that was used for the graphs of FIGS. 3–5 with the present invention for three cases: no fault (FIG. 6); modest fault (FIG. 7); and heavy fault (FIG. 8). In each of FIGS. 6–8, the noise, second harmonics, drift, and other disturbances have almost disappeared from the graphs. Moreover, the average negative sequence impedance correctly decreases as the magnitude of the fault is increased.

Figure 10:
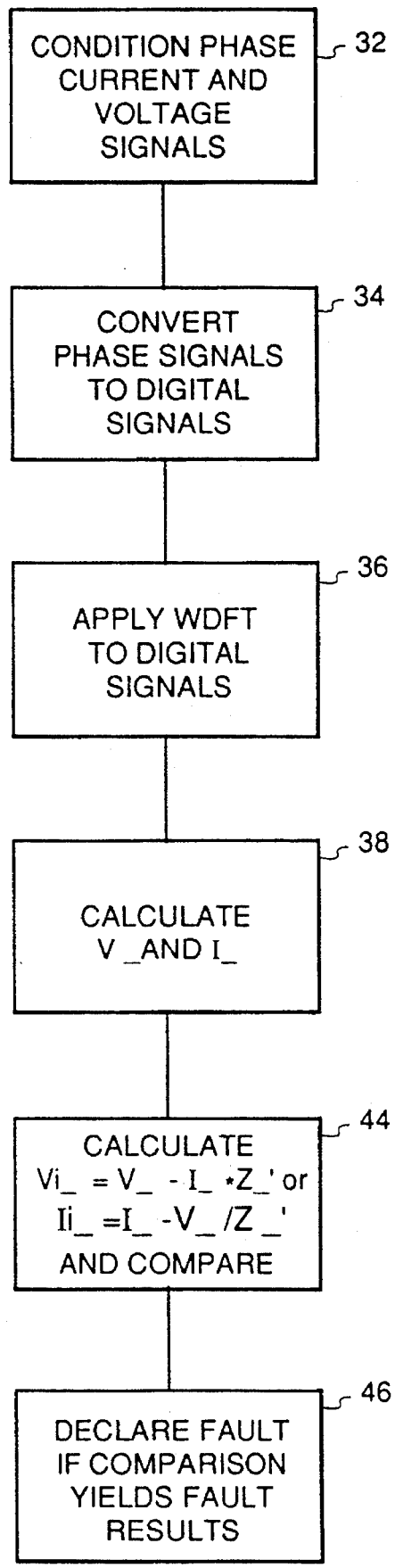
FIG. 10 is a flow chart similar to that of FIG. 9 which illustrates a related embodiment of the present invention which is particularly useful when the magnitude of negative sequence voltage on the incoming line is small.

FIG. 10 is a flow chart similar to that of FIG. 9 which illustrates a related embodiment of the present invention which is particularly useful when the magnitude of negative sequence voltage on the incoming line is small. When the magnitude of negative sequence voltage on the incoming line is small (sometimes less than 1%), e.g., the three phase power supply for the motor is not sufficiently unbalanced so as to provide a negative sequence excitation to the motor, both the negative sequence voltage and the negative sequence current are close to zero, and their division yields results that are sensitive to noise and calibration errors at best, and indeterminate at worst. This condition is desirable for optimum operation of three phase loads; however, it can create problems for negative sequence impedance based turn fault detectors. Because the negative sequence impedance is the ratio of negative sequence voltage to negative sequence current, the value of the calculated impedance can become indeterminate or very noisy when the negative sequence voltage happens to be very small. In this situation, an alternative, approximate estimation can be used. This estimation can also be used even if sufficient voltage imbalance exists.

The embodiment FIG. 10 is similar to that of FIG. 9, except that the calculations of V_ and I_ at step 38 are applied to a different calculation at step 44 of FIG. 10 for comparison purposes. A significant effect of a turn fault is the appearance of an extra or injected current in the faulted phase. If it were not for the possibility of a significant negative sequence voltage component or normal motor imbalance, a good strategy would be to simply look only at the negative sequence current. However, because of the possibility of voltage and motor imbalance, the current measurement is interpreted differently by computing $I_- - V_-/Z'_-$ where $I_-$ is the estimated negative sequence current, $V_-$ is the estimated negative sequence voltage, and $Z'_-$ is the approximate characteristic negative sequence impedance of the motor. The characteristic negative sequence impedance varies with load but is typically invariant to turn faults.

There are several techniques for determining $Z'_-$. Motor manufacturers sometimes provide circuit parameters. If the motor parameters are know and if they are reasonably independent of load, then $Z_-$ can be computed from the parameters. If a circuit parameter list is not available from the manufacturer, the parameters can be measured. One measurement technique is to run the motor under normal conditions, run the motor under locked rotor conditions, and process resulting data to produce the equivalent circuit parameters.

Figure 11:
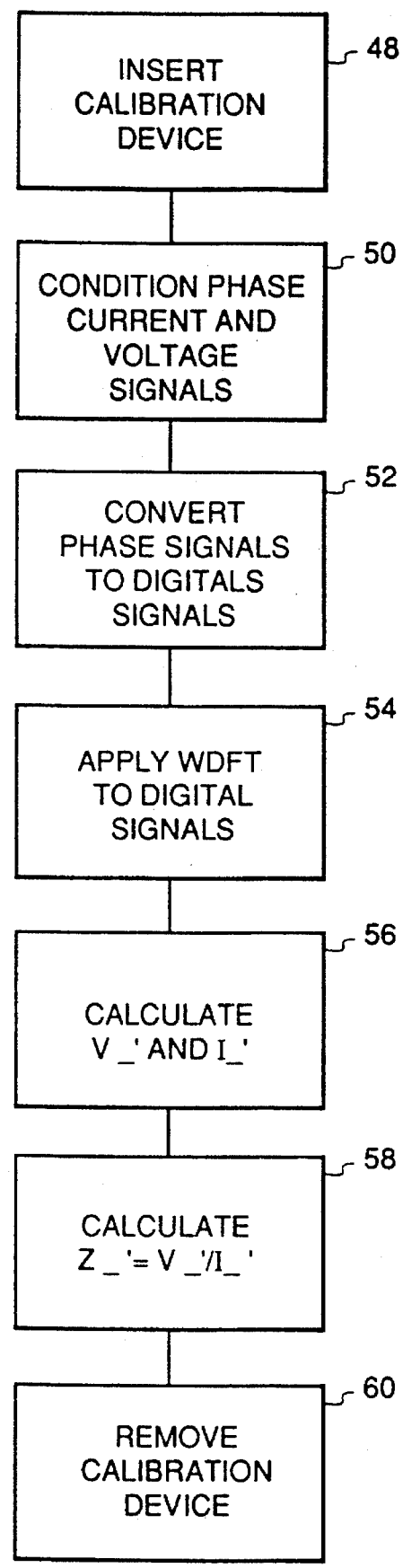
FIG. 11 is a flow chart illustrating one method for obtaining a parameter value for use in the embodiment shown in FIG. 10.

An alternate measurement technique is illustrated in FIG. 11, which is a flow chart of a preferred method for obtaining $Z'_-$ for use in the embodiment shown in FIG. 10. During a testing sequence, at step 48, a calibration device 30 is inserted into one phase between the motor and the respective voltage sensor, as shown in FIG. 2. The calibration device may comprise a resistor or an inductor, for example, and should be capable of dropping at least about 1% of the line voltage, i.e. about 4.5 volts on the 460 volt motors in common use. Line current ranges from 4.5 amps to 450 amps, so, if a resistor is used, the power rating of this resistor preferably ranges from 20 watts to 2 KW.

After the calibration device is inserted, current and voltage waveforms are sensed and steps 50, 52, 54, and 56 are performed in the manner described with respect to FIG. 9, except that the waveforms obtained of $V'_-$ and $I'_-$ are waveforms which have been affected by the presence of the calibration device. With the voltage sensors connected on the motor side there will be sufficient unbalance to guarantee a reliable calculation of $Z'_-$ when computed as $Z'_- = V'_-/I'_-$ at step 58. The calibration device is removed at step 60 before normal operation of the motor is resumed.

At step 46 in FIG. 10, a turn fault is indicated when the magnitude of $I_- - V_-/Z'_-$ exceeds a threshold. If the magnitude is zero, there is no fault. Either a fixed or a variable threshold is possible, depending on whether it is desired to increase sensitivity if the motor is lightly loaded. If a fixed threshold is used, the threshold is selected based on the desired degree of sensitivity, while considering that the lower limit of sensitivity is dictated by residual measurement errors, motor unbalance, and noise.

For additional sensitivity, it is possible to vary the threshold in proportion to the magnitude of the positive sequence current ($I_+$), particularly if the major portion of the error in the estimate of negative sequence current is due to a calibration error.

A variation of this invention is to monitor the equivalent back voltage in the negative sequence circuit, which is equal to $V_- - I_- * Z_-$, and to declare a turn fault when the back voltage exceeds a certain threshold.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for detecting turn faults in an induction motor comprising the steps of:

obtaining motor current waveforms;

obtaining motor voltage waveforms;

converting the motor current waveforms to digitized current waveforms and the motor voltage waveforms to digitized voltage waveforms;

applying a weighted discrete fourier transform to the digitized current waveforms and digitized voltage waveforms to obtain symmetrical component current phasors and symmetrical component voltage phasors; and determining the existence of a turn fault by employing the symmetrical component current phasors and symmetrical component voltage phasors.

2. The method of claim 1, wherein the step of applying a weighted discrete fourier transform to the digitized current waveforms and digitized voltage waveforms to obtain symmetrical component current phasors and symmetrical component voltage phasors includes obtaining a negative sequence voltage phasor and a negative sequence current phasor; and wherein the step of determining the existence of a turn fault comprises estimating an apparent negative sequence impedance by dividing the negative sequence voltage phasor by the negative sequence current phasor, and comparing the estimated apparent negative sequence impedance with a threshold negative sequence impedance.

3. The method of claim 1, wherein the step of applying a weighted discrete fourier transform to the digitized current waveforms and digitized voltage waveforms to obtain symmetrical component current phasors and symmetrical component voltage phasors includes obtaining a negative sequence voltage phasor and a negative sequence current phasor; and wherein the step of determining the existence of a turn fault comprises estimating a current differential by dividing the negative sequence voltage phasor by a characteristic negative sequence impedance and subtracting the result from the negative sequence current phasor, and comparing the estimated current differential with a threshold current differential.

4. The method of claim 3, wherein the characteristic negative sequence impedance is obtained by a method comprising the steps of:

inserting a calibration device into one phase of the motor;

obtaining calibration motor current waveforms;

obtaining calibration motor voltage waveforms;

converting the calibration current waveforms to calibration digitized current waveforms and the calibration motor voltage waveforms to calibration digitized voltage waveforms;

applying a weighted discrete fourier transform to the calibration digitized current waveforms and calibration digitized voltage waveforms to obtain a calibration negative sequence current phasor and a calibration negative sequence voltage phasor; and dividing the calibration negative sequence voltage phasor by the calibration negative sequence current phasor.

5. The method of claim 1, wherein the step of applying a weighted discrete fourier transform to the digitized current waveforms and digitized voltage waveforms to obtain symmetrical component current phasors and symmetrical component voltage phasors includes obtaining a negative sequence voltage phasor and a negative sequence current phasor; and wherein the step of determining the existence of a turn fault comprises estimating a voltage differential by multiplying the negative sequence current phasor by a characteristic negative sequence impedance and subtracting the result from the negative sequence voltage phasor, and comparing the estimated voltage differential with a threshold voltage differential.

6. The method of claim 5, wherein the characteristic negative sequence impedance is obtained by a method comprising the steps of:

inserting a calibration device into one phase of the motor;

obtaining calibration motor current waveforms;

obtaining calibration motor voltage waveforms;

converting the calibration current waveforms to calibration digitized current waveforms and the calibration motor voltage waveforms to calibration digitized voltage waveforms;

applying a weighted discrete fourier transform to the calibration digitized current waveforms and calibration digitized voltage waveforms to obtain a calibration negative sequence current phasor and a calibration negative sequence voltage phasor; and dividing the calibration negative sequence voltage phasor by the calibration negative sequence current phasor.

7. A method for obtaining a characteristic negative sequence impedance of an ac motor comprising the steps of:

inserting a calibration device into one phase of the motor;

obtaining calibration motor current waveforms;

obtaining calibration motor voltage waveforms;

converting the calibration current waveforms to calibration digitized current waveforms and the calibration motor voltage waveforms to calibration digitized voltage waveforms;

applying a weighted discrete fourier transform to the calibration digitized current waveforms and calibration digitized voltage waveforms to obtain a calibration negative sequence current phasor and a calibration negative sequence voltage phasor; and dividing the calibration negative sequence voltage phasor by the calibration negative sequence current phasor.

8. The method of claim 7, wherein the calibration device comprises a device selected from the group consisting of resistors and inductors.

9. An apparatus for detecting turn faults in an induction motor, the apparatus comprising:

at least two current sensors for obtaining at least two motor current waveforms;

at least two voltage sensors for obtaining at least two motor voltage waveforms;

an analog to digital converter for converting the motor current waveforms to digitized current waveforms and the motor voltage waveforms to digitized voltage waveforms;

a processor for applying a weighted discrete fourier transform to the digitized current waveforms and digitized voltage waveforms to obtain symmetrical component current phasors and symmetrical component voltage phasors, and for determining the existence of a turn fault by employing the symmetrical component current phasors and symmetrical component voltage phasors.

10. The apparatus of claim 9, wherein the processor includes means for obtaining a negative sequence voltage phasor and a negative sequence current phasor, estimating an apparent negative sequence impedance by dividing the negative sequence voltage phasor by the negative sequence current phasor, and comparing the estimated apparent negative sequence impedance with a threshold negative sequence impedance.

11. The apparatus of claim 9, wherein the processor includes means for obtaining a negative sequence voltage phasor and a negative sequence current phasor, estimating a current differential by dividing the negative sequence voltage phasor by a characteristic negative sequence impedance and subtracting the result from the negative sequence current phasor, and comparing the estimated current differential with a threshold current differential.

12. The apparatus of claim 9, wherein the processor includes means for obtaining a negative sequence voltage phasor and a negative sequence current phasor, estimating a voltage differential by multiplying the negative sequence current phasor by a characteristic negative sequence impedance and subtracting the result from the negative sequence voltage phasor, and comparing the estimated voltage differential with a threshold voltage differential.

13. An apparatus for obtaining a characteristic negative sequence impedance of a motor, the apparatus comprising:

at least two current sensors for obtaining at least two motor current waveforms;

at least two voltage sensors for obtaining at least two motor voltage waveforms;

a calibration device coupled between the motor and a respective one of the voltage sensors;

an analog to digital converter for converting the motor current waveforms to digitized current waveforms and the motor voltage waveforms to digitized voltage waveforms;

a processor for applying a weighted discrete fourier transform to the digitized current waveforms and digitized voltage waveforms to obtain a calibration negative sequence current phasor and a calibration negative sequence voltage phasor and for dividing the calibration negative sequence voltage phasor by the calibration negative sequence current phasor.

14. The apparatus of claim 13, wherein the calibration device comprises a device selected from the group consisting of resistors and inductors.

* * * * *